United States Patent
Yamada et al.

(10) Patent No.: US 6,972,491 B2
(45) Date of Patent: Dec. 6, 2005

(54) SEMICONDUCTOR DEVICE INCLUDING MULTI-LAYERED INTERCONNECTION AND METHOD OF MANUFACTURING THE DEVICE

(75) Inventors: Masaki Yamada, Yokohama (JP); Hideki Shibata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/778,180

(22) Filed: Feb. 17, 2004

(65) Prior Publication Data

US 2005/0121791 A1  Jun. 9, 2005

(30) Foreign Application Priority Data

Dec. 5, 2003  (JP)  ............................. 2003-407888

(51) Int. Cl.[7] .......................... H01L 23/48; H01L 23/52
(52) U.S. Cl. ....................................... 257/758; 257/760
(58) Field of Search ................................ 257/758, 760

(56) References Cited

U.S. PATENT DOCUMENTS 6,534,395 B2 * 3/2003 Werkhoven et al. ........ 438/627

FOREIGN PATENT DOCUMENTS

JP  11-186273  7/1999
JP  2003-257979  9/2003

OTHER PUBLICATIONS

U.S. Appl. No. 10/778,180, filed Feb. 17, 2004, Yamada et al.
U.S. Appl. No. 11/095,567, filed Apr. 1, 2005, Higashi et al.

* cited by examiner

Primary Examiner—Tu Tu V Ho
(74) Attorney, Agent, or Firm—Oblon, Spivak, McClelland, Maier & Neustadt, P.C.

(57) ABSTRACT

The semiconductor device includes a semiconductor substrate and a multi-layer wiring portion including insulating layers and wiring layers alternately stacked one on another on a main surface of the semiconductor substrate. The resistance value of a wiring layer located on an upper side of an adjacent pair of wiring layers is lower than or equal to that of a wiring layer located on a lower side of the adjacent pair, and the resistance value of the lowermost layer is higher than that of the uppermost layer. The specific inductive capacity of an insulating layer located on an upper side of an adjacent pair of insulating layers is higher than or equal to that of an insulating layer located on a lower side of the adjacent pair, and the specific inductive capacity of the lowermost layer is lower than that of the uppermost layer.

16 Claims, 8 Drawing Sheets

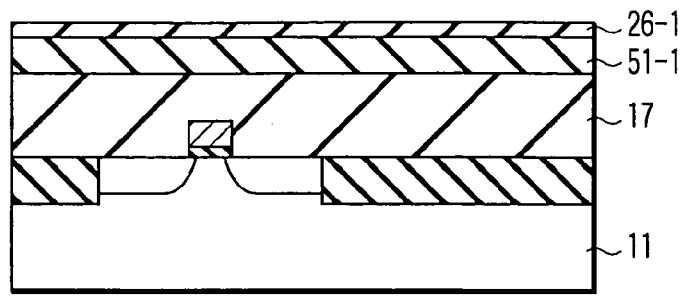
F I G. 12
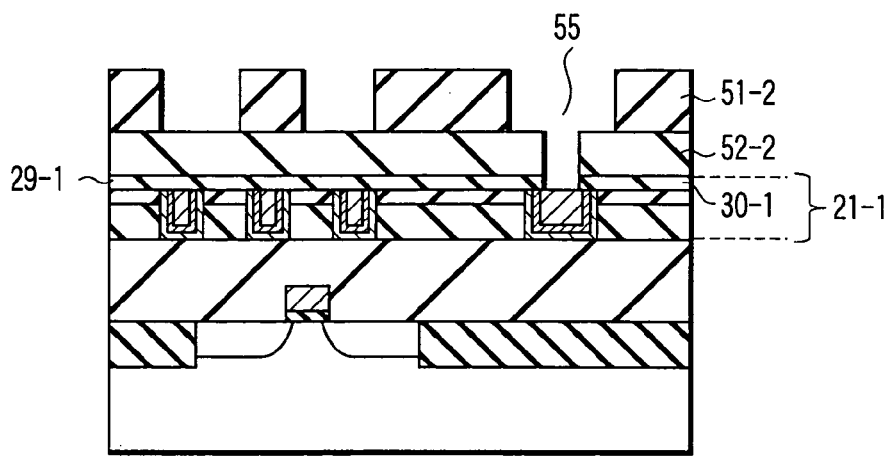
F I G. 13
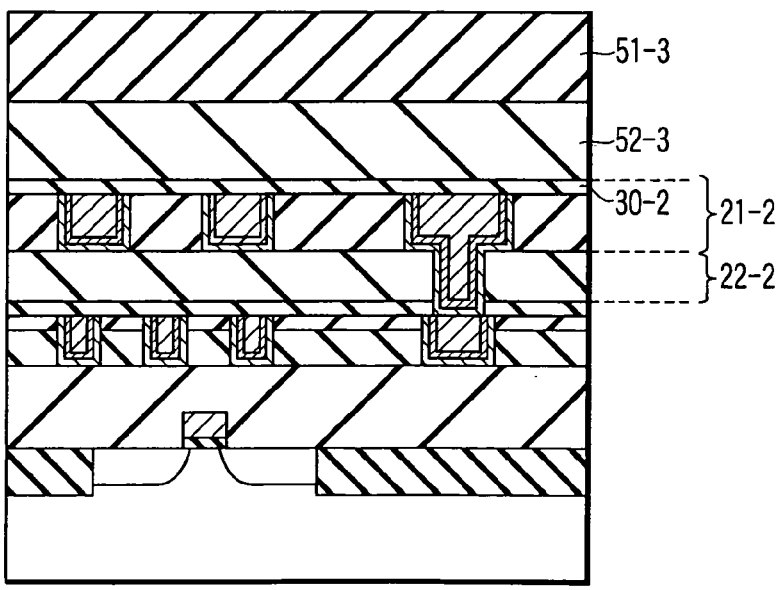
F I G. 14

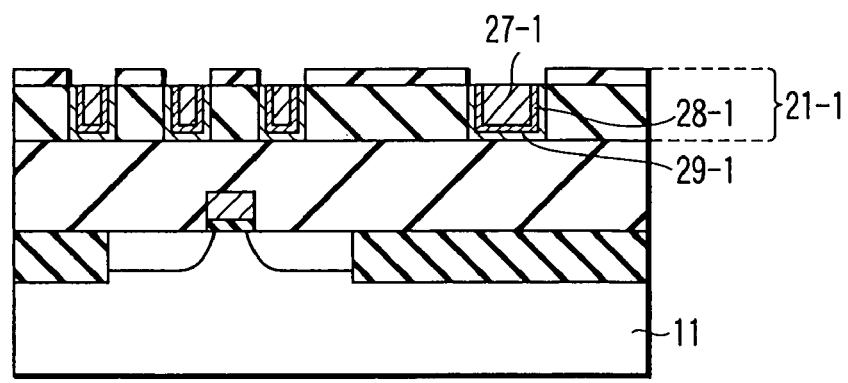
F I G. 17
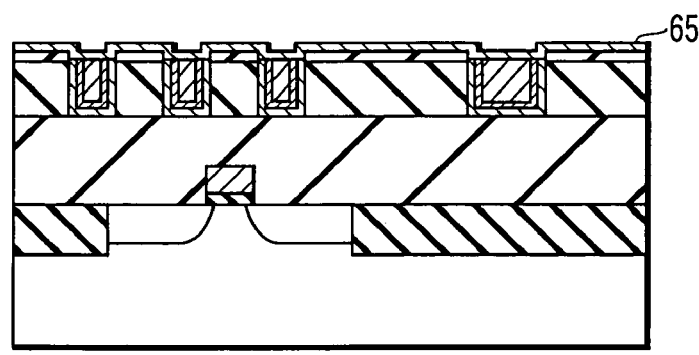
F I G. 18
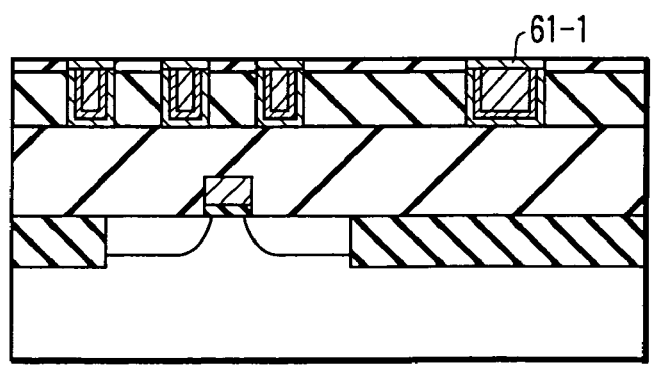
F I G. 19

SEMICONDUCTOR DEVICE INCLUDING MULTI-LAYERED INTERCONNECTION AND METHOD OF MANUFACTURING THE DEVICE

CROSS-REFERENCE TO RELATED APPLICATIONS

This application is based upon and claims the benefit of priority from prior Japanese Patent Application No. 2003-407888, filed Dec. 5, 2003, the entire contents of which are incorporated herein by reference.

BACKGROUND OF THE INVENTION

1. Field of the Invention

The present invention relates to a semiconductor device and a method of manufacturing the device, which can be applied to, for example, an LSI (large scale integrated circuit) involving multi-layered interconnection.

2. Description of the Related Art

Recently, the essential parts of computers or communication devices use, in most cases, an LSI circuit in which a great number of transistors and resistances are coupled with each other to form an electric circuit structure and integrated on a chip. With this structure, the performance of the entire device depends greatly on the performance of each single unit of the LSI circuits used in the device. Therefore, the performance of the LSI circuit can be improved by, for example, increasing the degree of integration, that is, reducing the size of the elements that constitute the LSI circuit. In order to actually realize the reduction of size of these elements, it is necessary to reduce the size of the wiring section for connecting one element with another and to increase the number of wiring layers.

However, at the same time, as a result of reducing the size of the wiring section and increasing the number of layers, that have been advanced in order to meet the demand of reducing the size of elements, the following drawback has become prominent. That is, the resistance of the conductive layer itself and the parasitic capacity between wiring sections (inter-wiring capacity, inter-layer capacity, etc.) are increased, thereby causing a more signal delay.

Under the circumstances, in order to reduce the parasitic capacity between the conductive layers, a method of decreasing the specific inductive capacity of an interlayer insulating film has been proposed. However, the reduction of the specific inductive capacity by this method is limited due to the physical properties and the like of the material.

In the meantime, there has been proposal of a method of, for example, reducing the opposing area between conductive layers (or reducing the thickness of the wiring film) while lowering the specific inductive capacity of the interlayer insulating film. However, with this method, the resistance value of the conductive layer is increased due to a decrease in the thickness of the film, although it is possible to decrease the parasitic capacity.

Under the circumstances, recently, the use of an aluminum (Al)-based conductive layer, which is conventionally used, has been switched to the use of a copper (Cu)-based conductive layer, Cu having a resistance value about 40% lower than that of Al, in order to reduce the wiring resistance. (See, for example, Jpn. Pat. Appln. KOKAI Publication No. H11-186273.)

However, the thickness of each conductive layer is significantly reduced due to the increase in the number of conductive layers and the reduction in the size of layers, and therefore the current density, etc. of the conductive layer is increased. Thus, even with a Cu-based conductive layer such as mentioned above, the lowering of the reliability is inevitable. Further, in the case of the Cu-based conductive layer, Cu in the boundary between wiring layers, especially in a lower layer side, is diffused, which results in the lowering of the reliability. Thus, switching from the Al-based conductive layer to the Cu-based conductive layer makes it possible to reduce the wiring resistance; however at the same time, the best method of lowering the interlayer capacity acts in reverse, and causes the lowering of the reliability of the conductive layer.

BRIEF SUMMARY OF THE INVENTION

A semiconductor device according to one aspect of the invention comprises a semiconductor substrate, and a multi-layer wiring portion including insulating layers and wiring layers alternately stacked one on another on a main surface of the semiconductor substrate, a resistance value of a wiring layer located on an upper side of an adjacent pair of wiring layers included in the multi-layer wiring portion is lower than or equal to that of a wiring layer located on a lower side of the adjacent pair, and the resistance value of the lowermost layer is higher than that of the uppermost layer, and a specific inductive capacity of an insulating layer located on an upper side of an adjacent pair of insulating layers included in the multi-layer wiring portion is higher than or equal to that of an insulating layer located on a lower side of the adjacent pair, and the specific inductive capacity of the lowermost layer is lower than that of the uppermost layer.

A method of manufacturing a semiconductor device according to one aspect of the invention comprises forming a plurality of insulating layers on a main surface of a semiconductor substrate, an insulating material being selected for each of the insulating layers such that a specific inductive capacity of the lowermost layer is lower than that of the uppermost layer, forming a plurality of wiring layers between respective pairs of the insulating layers, and adding an additive element to the wiring layers such that a concentration of the additive element of the uppermost layer is lower than that of the lowermost layer.

BRIEF DESCRIPTION OF THE SEVERAL VIEWS OF THE DRAWING

FIG. 12 is a diagram showing a step in the process of a method of manufacturing the semiconductor device according to the second embodiment;

FIG. 13 is a diagram showing another step in the process of a method of manufacturing the semiconductor device according to the second embodiment;

FIG. 14 is a diagram showing still another step in the process of a method of manufacturing the semiconductor device according to the second embodiment;

FIG. 17 is a diagram showing a step in the process of a method of manufacturing the semiconductor device according to the third embodiment;

FIG. 18 is a diagram showing another step in the process of a method of manufacturing the semiconductor device according to the third embodiment; and FIG. 19 is a diagram showing still another step in the process of a method of manufacturing the semiconductor device according to the third embodiment.

DETAILED DESCRIPTION OF THE INVENTION

Figure 1:
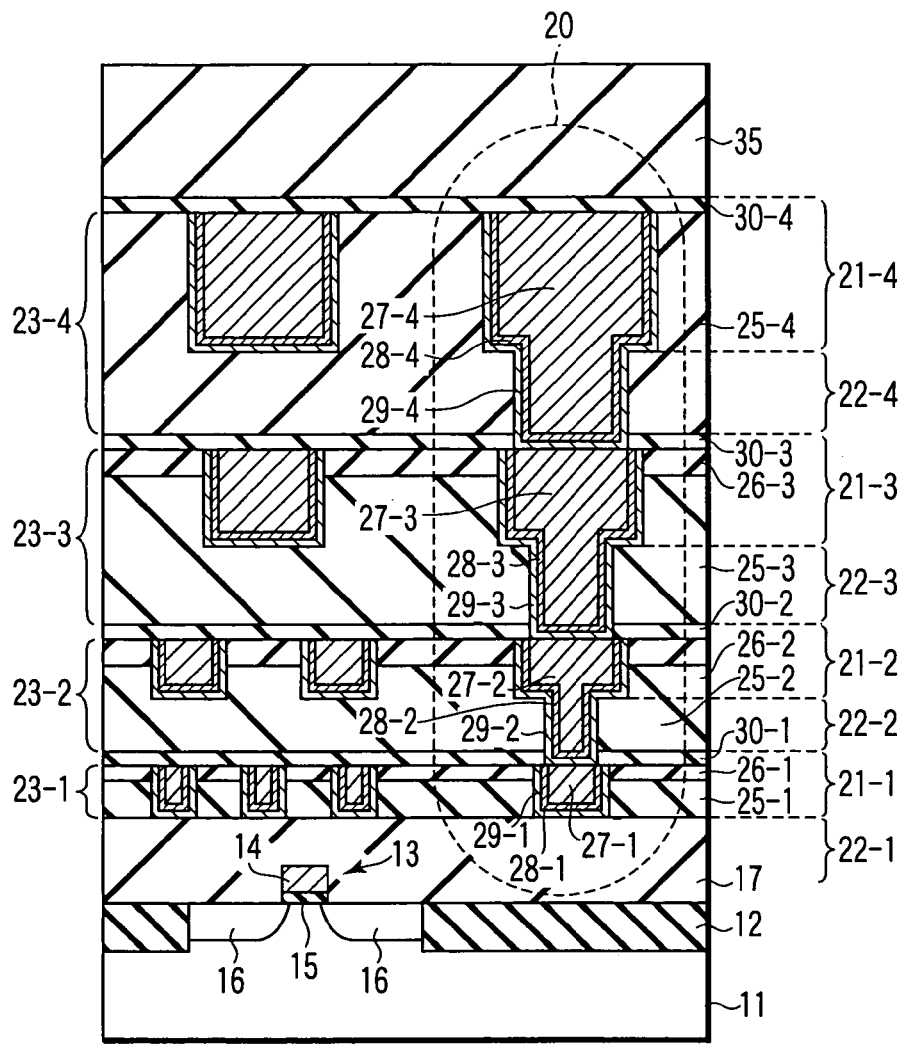
FIG. 1 is a schematic structural diagram showing a cross section of a semiconductor device according to the first embodiment of the present invention.

Embodiments of the present invention will now be described in detail with reference to accompanying drawings. In the explanations of these embodiments, common structural parts are designated by the same reference numerals throughout the figures.

[First Embodiment]

With reference to FIGS. 1 to 10, a semiconductor device according to the first embodiment of the present invention and a method of manufacturing the device will now be described. FIG. 1 is a schematic structural diagram showing a cross section of the semiconductor device according to the first embodiment, taking, as an example, a case where four wiring layers are formed on the main surface of a semiconductor substrate 11.

As shown in FIG. 1, a MOSFET (metal oxide semiconductor field effect transistor) 13 is formed in an element formation region that is separated by an element insulating film 12 embedded in the main surface of the semiconductor substrate 11. The MOSFET 13 includes a gate oxide film 15 formed on the semiconductor substrate 11, a gate electrode 14 formed on the gate oxide film 15 and an impurity diffusion region 16 formed to be isolated in the semiconductor substrate 11 and serving as source-drain regions. Further, on the entire main surface of the semiconductor substrate 11, an interlayer insulating film 17 is formed.

A multi-layer wiring portion including four wiring layers is formed on the interlayer insulating film 17. The first to fourth wiring layers 21-1 to 21-4 are formed embedded in inter-wiring insulating layers 23-1 to 23-4, respectively. (Here, the inter-wiring insulating layers 23-1 to 23-4 are combinations of insulating layers 25-1 to 25-4 and cap insulating layers 26-1 to 26-4, respectively.) The wiring layers 21-1 to 21-4, which are formed to be adjacent to each other in an up-and-down direction, are connected selectively by means of connection portions 22-1 to 22-4, respectively. FIG. 1 shows an example in which all of the wiring layers 21-1 to 21-4 are connected in common in a region 20 indicated by broken line. It should be noted here that the connection portion 22-1 of the first wiring layer 21-1 is connected to, for example, a drain region of the MOSFET although it is not shown in the figure.

The wiring layers 21-1 to 21-4 and the connection portions 22-1 to 22-4 are made of conductive layers 27-1 to 27-4, seed layers 28-1 to 28-4 and lower diffusion inhibiting layers 29-1 to 29-4, respectively.

The conducting layers 27-1 to 27-4 are formed embedded in the inter-wiring insulating layers 23-1 to 23-4, respectively. The seed layers 28-1 to 28-4 are formed between the conductive layers 27-1 to 27-4 and the lower diffusion inhibiting layers 29-1 and 29-4, respectively. The lower diffusion inhibiting layers 29-1 and 29-4 are formed in the boundaries with respect to the inter-wiring insulating layers of 23-1 to 23-4. It should be noted that the seed layers 28-1 to 28-4 are integrated with the conductive layers, 27-1 to 27-4, respectively, and therefore the boundaries unclear. Thus, in many cases, there are no substantial boundaries formed.

Upper diffusion inhibiting layers 30-1 to 30-4 are formed on the cap insulating layers 26-1 to 26-4, the conductive layers 27-1 to 27-4, the seed layers 28-1 to 28-4 and the lower diffusion inhibiting layers 29-1 to 29-4, respectively.

The first wiring layer (the lowermost layer) 21-1 has the narrowest wiring width and the least thickness as compared to the other wiring layers 21-2, 21-3 and 21-4. For example, the width of the first seed layer 28-1, which is taken along a channel direction of the MOSFET 13, is as small as about 0.1 $\mu$m.

It is preferable that the first conductive layers 27-1 and the first seed layer 28-1 should be formed of the same basis metal, for example, copper (Cu). The first seed layer 28-1 contains a small amount of additive element such as magnesium (Mg). The first lower diffusion inhibiting layer 29-1 is made of, for example, a tantalum film having a thickness of about 10 nm.

Note that other examples of the additive element are titanium (Ti), aluminum (Al), tin (Sn), palladium (Pb), ruthenium (Ru), rhodium (Rh), chromium (Cr), silver (Ag), cobalt (Co), indium (In), copper (Cu), etc.

The first insulating layer 25-1 should preferably be made of a material having a low specific inductive capacity. In this embodiment, this layer is made of, for example, a SiOC film having a specific inductive capacity of about 2.5. Alternatively, the first insulating layer 25-1 may be made of, for example, a silicate-based film or polymer-based film.

There are two types of silicate-based film, one is an organic-based film that contains an organic component and the other is an inorganic-based film that contains no organic component. Further, in some cases, it is not always necessary that the device should be made of a material with a low specific inductive capacity. That is, there are some product devices that do not require the lowering of the specific inductive capacity in their insulating films. Therefore, in such a product group, it is also possible to employ silicon oxide films that have been generally used.

The first cap insulating layer 26-1 is formed of, for example, a SiO$_2$ film, and the first upper diffusion inhibiting layer 30-1 is formed of, for example, a thin SiC film.

Next, the second wiring layer 21-2 has a wiring width that is slightly larger than that of the first wiring layer 21-1, and a film thickness that is larger than that.

It is preferable that the second conductive layer 27-2 should be made of a basis metal such as Cu. The second seed layer 28-2 should preferably made of, for example, an almost pure basis metal of Cu that does not contain additive element. The thickness of this layer is about 80 nm. The second lower diffusion inhibiting layer 29-2 is made of, for example, a tantalum film having a thickness of about 15 nm.

The second insulating layer 25-2 is made of, for example, a SiOC film having a specific inductive capacity of about 2.5. The second upper diffusion inhibiting layer 30-2 is formed of, for example, a thin SiC film.

Next, the third wiring layer 21-3 has a wiring width that is slightly larger than that of the second wiring layer 21-2, and a film thickness that is larger than that. It is preferable that the third conductive layer 27-3 should be made of a basis metal such as Cu, and the thickness of this layer is about 100 nm. The third seed layer 28-3 should preferably made of, for example, an almost pure basis metal of Cu that does not contain additive element. The third lower diffusion inhibiting layer 29-3 is made of, for example, a tantalum nitride film having a thickness of about 15 nm.

The third insulating layer 25-3 is made of, for example, a fluorine-added silicon oxide film having a specific inductive capacity of about 3.0. The third upper diffusion inhibiting layer 30-3 is formed of, for example, a thin SiN film.

Next, the fourth wiring layer 21-4 is the uppermost layer, and has the largest wiring width and largest film thickness of all the layers.

The fourth conductive layer 27-4 is made of a basis metal such as Cu, the thickness of this layer is about 1500 nm. The fourth seed layer 28-4 should preferably made of, for example, an almost pure basis metal of Cu that does not contain additive element. The fourth lower diffusion inhibiting layer 29-4 is made of, for example, a tantalum nitride film having a thickness of about 30 nm.

The fourth insulating layer 25-4 is made of, for example, a silicon oxide film having a relatively large specific inductive capacity (of about 4.0). The fourth upper diffusion inhibiting layer 30-4 is formed of, for example, a thin SiN film.

On the fourth upper diffusion inhibiting layer 30-4, for example, a silicon nitrogen film (SiN film) is formed, thus forming an upper insulating layer 35.

As described above, the additive element is added to each of the seed layers 28-1 to 28-4 in such a manner that the concentration of the additive is higher or equal in an upper layer side, and the concentration thereof is lower in the uppermost layer than in the lowermost layer. Accordingly, the resistance values of the wiring layers 21-1 to 21-4 are in such a fashion that those of the upper layer side have higher or equal resistance value, and the resistance value is lower in the uppermost layer than in the lowermost layer.

Consequently, as the level of the layer is lower in the wiring layers 21, the concentration of the additive element in that layer is higher, and the current density is lower. Thus, the reliability is improved more as the layer level is lower. Especially, in the case of the lowermost wiring layer 21-1, the wiring width, in many cases, becomes as small as its minimum processing measurement. Therefore, the above-described structure is even more advantageous.

On the other hand, in the upper one of the wiring layers 21, an almost pure basis metal such as of Cu is applied to, for example, the seed layers 27 and conductive layers 28. With this structure, the resistance value of the upper one of the wiring layers 21 becomes low, and therefore it is possible to allow a great amount of current to flow. Especially, in the case of the uppermost wiring layer 21-4, a great amount of current supplied from a power line or the like, can be made to flow. Therefore, the above-described structure is even more advantageous.

As described above, the concentration of the additive element in the lower one of the wiring layers, where the importance is placed specially on the reliability, is increased, whereas the concentration of the additive element in the upper one of the wiring layers, where a great amount of current should be made to flow, is lowered. In this manner, the improvement of the reliability and the lowering of the wiring resistance can be achieved both at the same time.

Further, the additive element introduced to the seed layers 27 is segregated mainly in the boundaries of the seed layers 27, more specifically, the boundary between one of the seed layers 28 and the respective one of the conductive layers 27, and the boundary between one of the seed layers 28 and the respective one of the lower diffusion inhibiting layers 29. Therefore, in the boundaries between the seed layers 28 and the conductive layers 27, when the conductive layers 27 are made of a basis metal Cu, the additive element works to do "pining" in the grain boundary of Cu (that is, the element is fixed by pinning to the grain boundary of Cu), and thus the element serves to block the diffusion of Cu in the boundaries. Further, in the boundaries between the seed layer 28 and the lower diffusion inhibiting layers 29, the adherence between each one of the seed layers 28 and the respective one of the lower diffusion inhibiting layers 29 is improved, and thus the element serves to block the diffusion in each of the boundaries. Thus, the reliability can be improved.

As described above, the additive element is contained in each of the seed layers 28-1 to 28-4 in such a manner that the concentration of the additive is higher or equal in an upper layer side, and the concentration thereof is lower in the uppermost layer than in the lowermost layer. In other words, the additive element is contained such that the concentration of the element is higher in a layer that has a longer boundary per cross sectional area in the basis metal layer serving as the respective conductive layer 27. With this structure, it is possible to improve the reliability of each of the conductive layers 27, seed layers 28 and lower diffusion inhibiting layers 29, which are located in a lower side, and which should serve the need for a higher reliability due to their structures of thin film and narrow wiring width.

As described above, the device according to this embodiment can inhibit the diffusion in the boundaries of the seed layers 28 and improve the adherence of the boundaries. Accordingly, it is possible to improve the reliability of the product device.

Further, the specific inductive capacity values of the insulating layers 25-1 to 25-4 are in such a manner that the value is higher in those in the upper section or equal, and the value of the uppermost layer is higher than that of the lowermost layer. Therefore, the capacity is lowered further as the level of the layer in the insulating layers 25 becomes lower, and thus the signal delay can be suppressed.

With the above-described structure, the signal delay can be decreased and the reliability can be improved in the multi-layer wiring section as a whole.

Further, in the upper diffusion inhibiting layers 30-1 to 30-4 as well, for example, a SiNC film, which has a lower specific inductive capacity, is employed in a lower one, and, for example, a SiN film, which has a higher specific inductive capacity, is employed in an upper one. Therefore, due to a similar effect to that described above, the signal delay can be further suppressed.

Furthermore, the lower diffusion inhibiting layers 29-1 to 29-4 are formed in the boundaries between the seed layers 28-1 to 28-4 and the inter-wiring insulating layers 23-1 to 23-4. With this structure, it is possible to prevent metals and the like contained in the seed layers 28-1 to 28-4 from diffusing into the inter-wiring insulating layers 23-1 to 23-4.

Next, with reference to FIGS. 2 to 10, the method of manufacturing the semiconductor device according to the first embodiment will now be described by taking, as an example, the case of the four-layer wiring semiconductor device shown in FIG. 1.

In these diagrams showing the steps of the manufacturing method with the cross sectional views of a semiconductor, the explanations of the steps of forming the element insulating film 12 and the MOSFET 13 are omitted, and the sections directly related to the steps of forming the first conductive layer (lowermost layer) 21-1, the second conductive layer (middle layer) 21-2, the third conductive layer (upper layer) 21-3 and the fourth conductive layer (uppermost layer) are illustrated. Here, the explanations will be made in connection with an example case where an embedding type Cu wiring (especially, dual-Damascene process).

Figure 2:
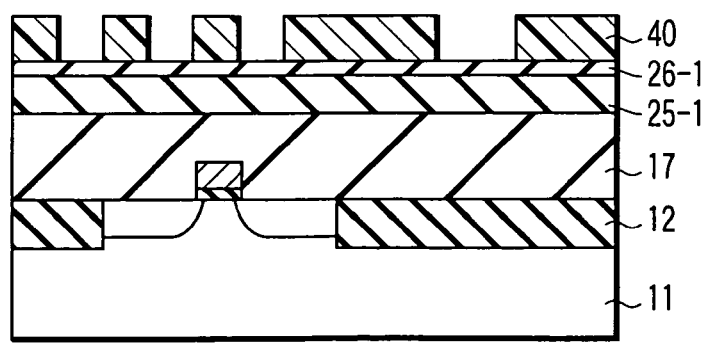
FIG. 2 is a diagram showing a step in the process of a method of manufacturing the semiconductor device according to the first embodiment.

First, the element insulating film 12 and the MOSFET 13 are formed by a conventional process. Then, as shown in FIG. 2, a TEOS film or the like is deposited on the main surface of the semiconductor substrate 11 by, for example, a CVD (chemical vapor deposition) method, thereby forming the inter-layer insulating film 17.

After that, SiOC (having a specific inductive capacity of about 2.5) is deposited on the inter-layer insulating film 17 by, for example, a low pressure plasma CVD method, thereby forming the first insulating layer 25-1. Further, $SiO_2$ is deposited on the resultant by, for example, a low pressure plasma CVD method, thereby forming the first cap layer 26-1. It should be noted here that the first cap insulating layer 26-1 serves as a cap film in a CMP (chemical mechanical polishing) process in a later step.

Here, there are several possible techniques for forming the first insulating layer 25-1, that is, for example, a technique of forming a silicate-based film or polymer-based film by the spin-coat method, and the technique of forming an organic-based film by the polymerization vapor deposition method. In the above-description, the process of forming a film having a low specific inductive capacity by the low pressure plasma CVD method was described. However, some product devices do not require to lower the specific inductive capacity in an inter-layer insulating film, and therefore in such a product group, a silicon oxide film or the like, which is conventionally used and formed by the CVD method, may be employed.

Further, a photoresist 40 is coated on the entire surface of the first cap insulating layer 26-1, and the photoresist 40 is subjected to exposure and development to pattern the photoresist.

Figure 3:
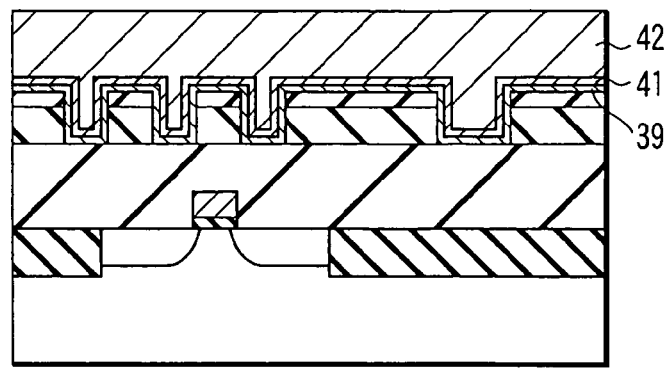
FIG. 3 is a diagram showing another step in the process of a method of manufacturing the semiconductor device according to the first embodiment.

Subsequently, as shown in FIG. 3, the first cap insulating layer 26-1 and the first insulating layer 25-1 are etched anisotropically one after another with an RIE (reactive ion etching) method using the photoresist 40 as a mask, thereby forming a wiring groove (trench) in which the fist conductive layer is embedded. After that, the photoresist 40 is removed.

Further, a basis metal, which gives rise to the first conductive layer, is applied thereon to fill cavities above the first cap insulating film 26-1. In this filling process, first, a tantalum (Ta) film 39 is formed by, for example, a spattering method to have a thickness of about 10 nm. Then, on the entire surface of the tantalum film 39, a Cu film 41 is formed to have a thickness of about 80 nm by, for example, a spattering method that uses a spatter target to which a small amount of magnesium (Mg) has been added. On the Cu film 41, a Cu film 42 having a thickness of about 800 nm is formed by, for example, an electric plating method.

Figure 4:
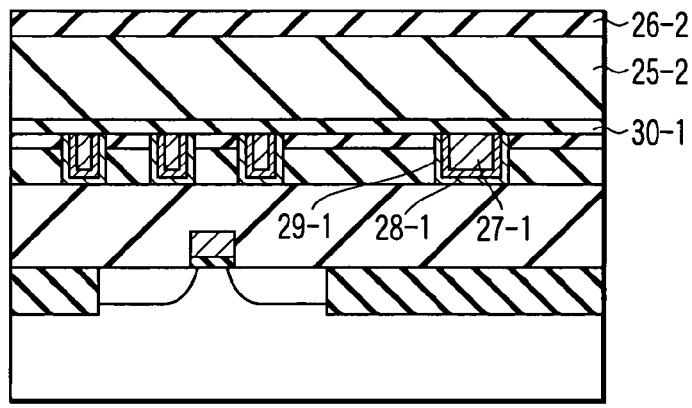
FIG. 4 is a diagram showing still another step in the process of a method of manufacturing the semiconductor device according to the first embodiment.

Subsequently, as shown in FIG. 4, the Cu film 42 is planed by, for example, a CMP method, so as to leave the Cu films 41 and 42 and the tantalum film 39 only in each wiring groove, and thus the first conductive layer 27-1, the first seed layer 28-1 and the first lower diffusion inhibiting layer 29-1 are formed. Further, on the entire surface, a thin SiOC film is deposited by, for example, a plasma CVD method, and thus the first upper diffusion inhibiting layer 30-1 is formed. Thus, the first wiring layer 21-1 is formed by the above-described process.

It should be noted that usually, the first seed layer 28-1 and the first conductive layer 27-1 are formed integrated as the Cu layers by the process in which the Cu film 42, which gives rise to the first conductive layer 27-1, is formed by the electric plating method or the like after forming the Cu film 41, which gives rise to the first seed layer 28-1. Therefore, the boundary between the first seed layer 28-1 and the first conductive layer 27-1 is not made prominent, and therefore in many cases, these layers are made without a substantial boundary between them. This is also the case for each of the boundaries between the other seed layers 28-2 to 28-4 and the other conductive layers 27-2 to 27-4, respectively.

Further, as shown in FIG. 4, a SiOC (having a specific inductive capacity of about 2.5) film or the like formed by for example, a low pressure plasma CVD method, is deposited, thereby forming the second insulating layer 25-2. Further, $SiO_2$ is deposited on the second insulating layer resultant by, for example, a low pressure plasma CVD method, thereby forming the second cap insulating layer 26-2.

Figure 5:
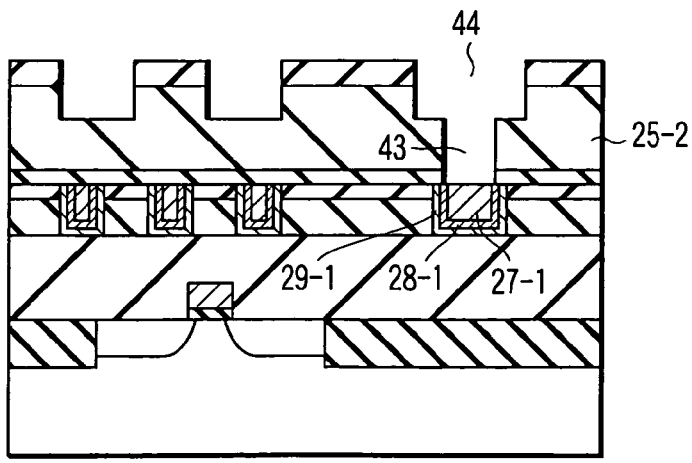
FIG. 5 is a diagram showing still another step in the process of a method of manufacturing the semiconductor device according to the first embodiment.

Subsequently, as shown in FIG. 5, a contact hole 43 having such a depth that reach the first conductive layer 27-1 is formed to pierce through the second insulating layer 25-2 and the second cap insulating layer 26-2 by the process of a dry etching method such as photolithography or RIE similar to that shown in FIG. 3. After that, the wiring groove 44 is formed by similar steps.

Figure 6:
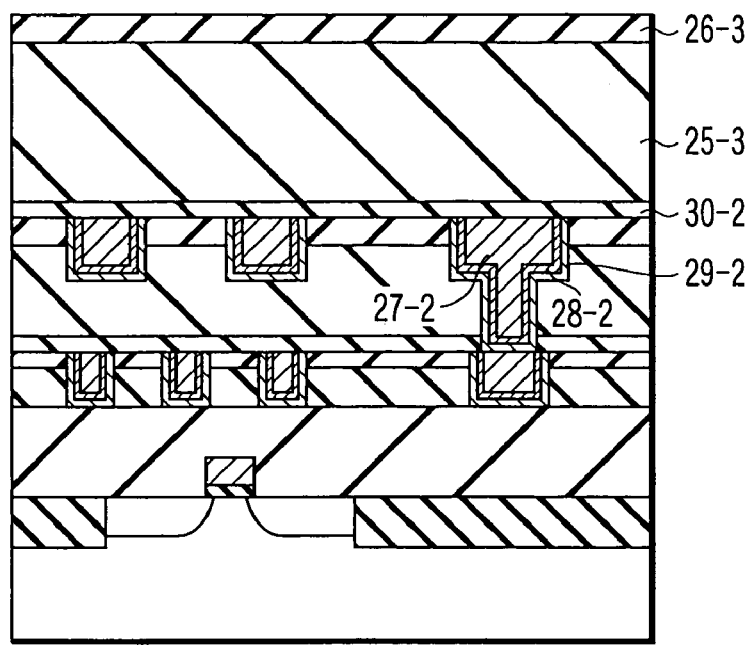
FIG. 6 is a diagram showing still another step in the process of a method of manufacturing the semiconductor device according to the first embodiment.

Next, as shown in FIG. 6, a metal film, which is connected to the first conductive layer 27-1 and serves as connecting metal, is applied thereon to fill cavities. In this filling process, first, a tantalum film, which serves as a diffusion inhibiting layer for the second conductive layer is deposited in the wiring groove 44 and the contact hole 43 by, for example, a spattering method to have a thickness of about 15 nm. Then, on the entire surface of the tantalum film, a Cu film is formed to have a thickness of about 80 nm by, for example, a spattering method that uses a spatter target that does not contain any additive element. In this filling process, unlike the above-described process, a spatter target that does not contain any additive element is used in order to suppress the increase in the resistance that is caused by the additional element. After that, a Cu film having a thickness of about 800 nm is formed on the entire surface that includes the contact hole 44 and the wiring groove 43 by, for example, an electric plating method.

Further, for example, the tantalum film and Cu film are planed by, for example, a CMP method, so as to leave the conductive layers only in each wiring groove, and thus the second conductive layer 27-2, the second seed layer 28-2 and the second lower diffusion inhibiting layer 29-2 are formed.

Furthermore, on the entire surface of each of the second conductive layers 27-2 and 28-2 and the second cap insulating layer 26-2, a thin SiC film is deposited by, for example, a plasma CVD method, and thus the second upper diffusion inhibiting layer 30-2 is formed.

Next, a fluorine-added silicon oxide film having a slightly higher specific inductive capacity (specific inductive capacity of about 3.0) than the above-described case, is deposited by, for example, a low pressure plasma CVD method, on the second upper diffusion inhibiting layer 30-2, thereby forming the third insulating layer 25-3. Then, $SiO_2$ is deposited on the third insulating layer 25-3 by, for example, a low pressure plasma CVD method, thus forming the cap insulating layer 26-3.

Figure 7:
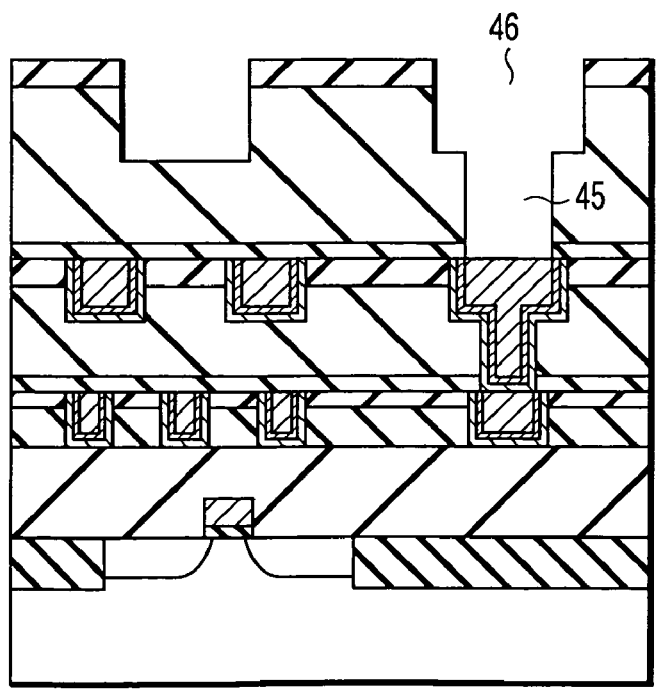
FIG. 7 is a diagram showing still another step in the process of a method of manufacturing the semiconductor device according to the first embodiment.

Subsequently, as shown in FIG. 7, the connecting hole 45 and the wiring groove 46 are formed by a lithography method and dry etching method similar to those mentioned above.

Figure 8:
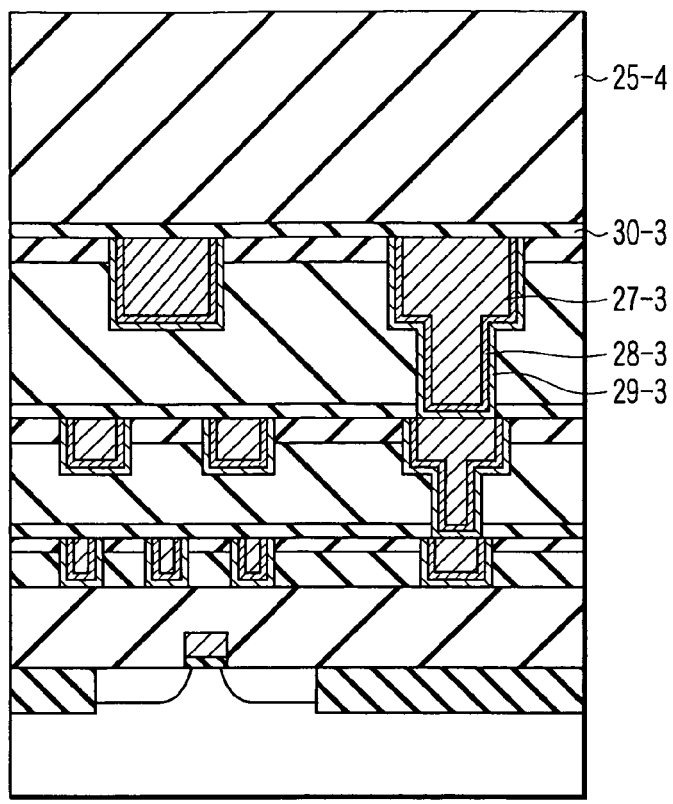
FIG. 8 is a diagram showing still another step in the process of a method of manufacturing the semiconductor device according to the first embodiment.

Next, as shown in FIG. 8, a metal film, which serves as the third conductive layer, is applied thereon to fill cavities. The third conductive layer is an upper layer, which has a wiring width and a film thickness larger than those of the middle layer.

In this filling process, first, a tantalum nitride film, which serves as a diffusion inhibiting layer for the Cu layer, is deposited in the entire surface including the wiring groove 45 and the contact hole 46 by, for example, a spattering method to have a thickness of about 20 nm. Then, on the entire surface of the tantalum nitride film which includes the wiring groove 46 and connecting hole 45, a Cu film is formed to have a thickness of about 100 nm by, for example, a spattering method that uses a spatter target that does not contain any additive element. After that, on this Cu film, a Cu film having a thickness of 1000 nm is formed by, for example, an electric plating method.

Further, for example, the tantalum film and Cu film are planed by, for example, a CMP method, so as to leave the conductive layers only in each wiring groove, and thus the third conductive layer 27-3, the third seed layer 28-3 and the third lower diffusion inhibiting layer 29-3 are formed. Then, on the entire surface of each of these layers, a thin SiN film is deposited by, for example, a plasma CVD method, and thus the third upper diffusion inhibiting layer 30-3 is formed.

The fourth wiring layer 21-4 is the uppermost layer and has the largest wiring width and largest film thickness of all the layers. First, a silicon oxide film having even a higher specific inductive capacity (specific inductive capacity of about 4.0) than the above-described case, is deposited by, for example, a low pressure plasma CVD method, on the entire surface, thereby forming the fourth insulating layer 25-4.

Figure 9:
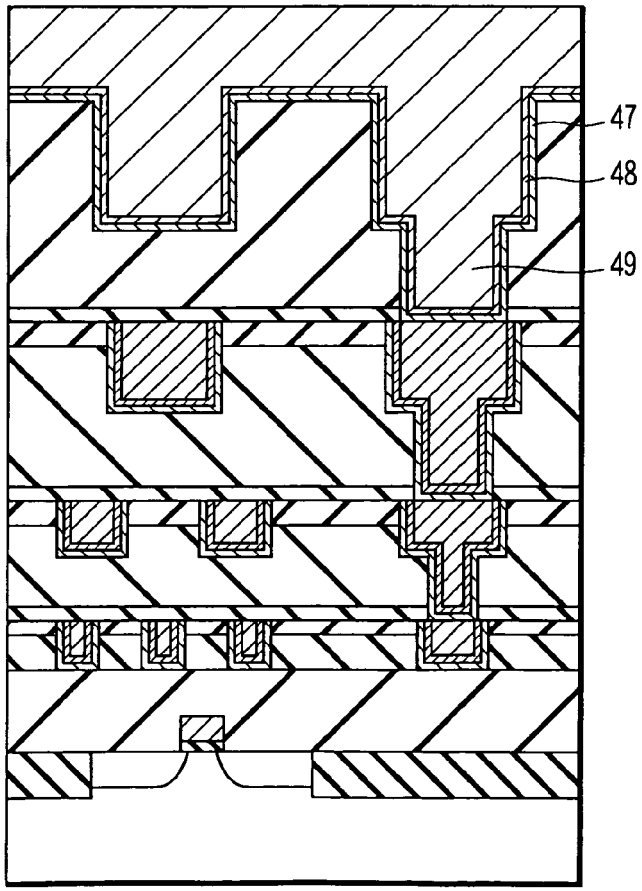
FIG. 9 is a diagram showing still another step in the process of a method of manufacturing the semiconductor device according to the first embodiment.

Subsequently, as shown in FIG. 9, the connecting hole and the wiring groove are formed by lithography method and dry etching method similar to those mentioned above. Further, on the entire surface, a tantalum nitride film 47, which serves as a diffusion inhibiting layer for the Cu layer is formed by, for example, a spattering method to have a thickness of about 30 nm. Then, on the tantalum nitride film 47 including the wiring groove and connecting hole, a Cu film 48 is formed to have a thickness of about 200 nm by, for example, a spattering method that uses a spatter target that does not contain any additive element. In this filling process, unlike the above-described process, a spatter target that does not contain any additive element is used in order to suppress the increase in the resistance that is caused by the additional element. After that, a Cu film 49 having a thickness of about 1500 nm is formed on the Cu film 48 by, for example, an electric plating method.

Figure 10:
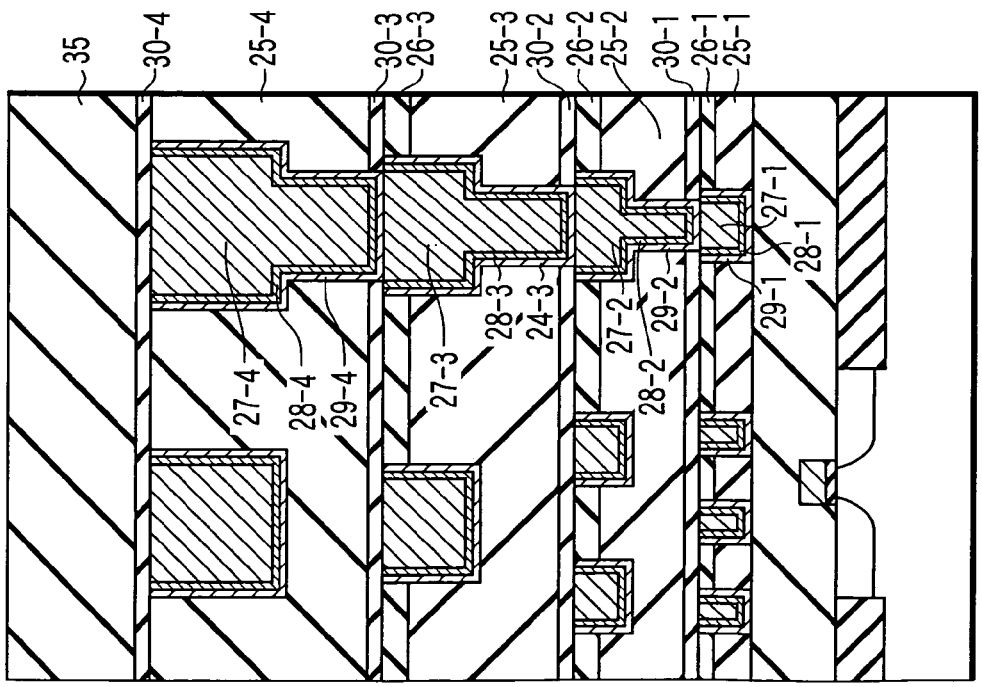
FIG. 10 is a diagram showing still another step in the process of a method of manufacturing the semiconductor device according to the first embodiment.

Subsequently, as shown in FIG. 10, the tantalum nitride film 47 and the Cu films 48 and 49 are planed by, for example, a CMP method, so as to leave the layers only in each wiring groove, and thus the fourth conductive layer 27-4, the fourth seed layer 28-4 and the fourth lower diffusion inhibiting layer 29-4 are formed. Further, on the entire surface of each layer, a thin SiN film is deposited by, for example, a plasma CVD method, and thus the fourth upper diffusion inhibiting layer 30-4 is formed. Lastly, on the entire surface, an SiN film or the like is formed by, for example, a plasma CVD method, and thus the upper insulating layer 35 is formed.

In the above-described process, the semiconductor device shown in FIG. 1 can be manufactured.

According to the above-described manufacturing method, the concentration of the additive element in lower layers of the seed layers 28 is increased, and thus the resistance value of the lower layer of the wiring layers 21, where a high reliability is required, is increased to decrease the current density. In this manner, the reliability can be improved. On the other hand, the concentration of the additive element in upper layers of the seed layers 28 is decreased (or no additive element is avoided), and thereby the resistance value of upper layers of the wiring layers 21, which require a great amount of current to flow therein, is decreased. In this manner, the reliability of the wiring layers 21-1 to 21-4 can be improved.

Further, as described above, the additive element is segregated mainly to the boundaries of the seed layers 28, and it serves to inhibit the boundary diffusion. More specifically, the boundary diffusion of, particularly, the lower layers of the wiring layers 21 is inhibited, and the adherence of the boundaries can be improved. In this manner, the reliability can be improved.

Further, an insulating material having a low specific inductive capacity is selected and used for lower layers, to form the insulating layers 25. Therefore, the capacity of the lower ones of the insulating layers 25, which have widths smaller than those of the wiring layers 21, is decreased, and thus the signal delay is can be reduced.

As described above, with the method according to the embodiment, it is possible to provide a method of manufacturing a semiconductor device that can reduce the signal delay and improve the reliability.

In the above-described process, the technique in which the additive element is contained in the seed layers 28 is presented by taking an example where the spattering method that uses a spatter target containing additive element is employed. As the technique of adding the additive element, various methods can be considered, that is, for example, adding the element to the lower diffusion inhibiting layer 29, adding it to plating liquid, applying it on the surface of the conductive layers 27 after the plating step and diffusing it, and flattening the conductive layers 27 and then applying the additive element on the surface of the conductive layer 27, thereby diffusing it, etc.

[Second Embodiment]

Next, a semiconductor device and a method of manufacturing the device, according to the second embodiment of the present invention, will now be described with reference to FIGS. 11 to 15. In the following descriptions, the sections that overlap with those of the first embodiment will be omitted.

Figure 11:
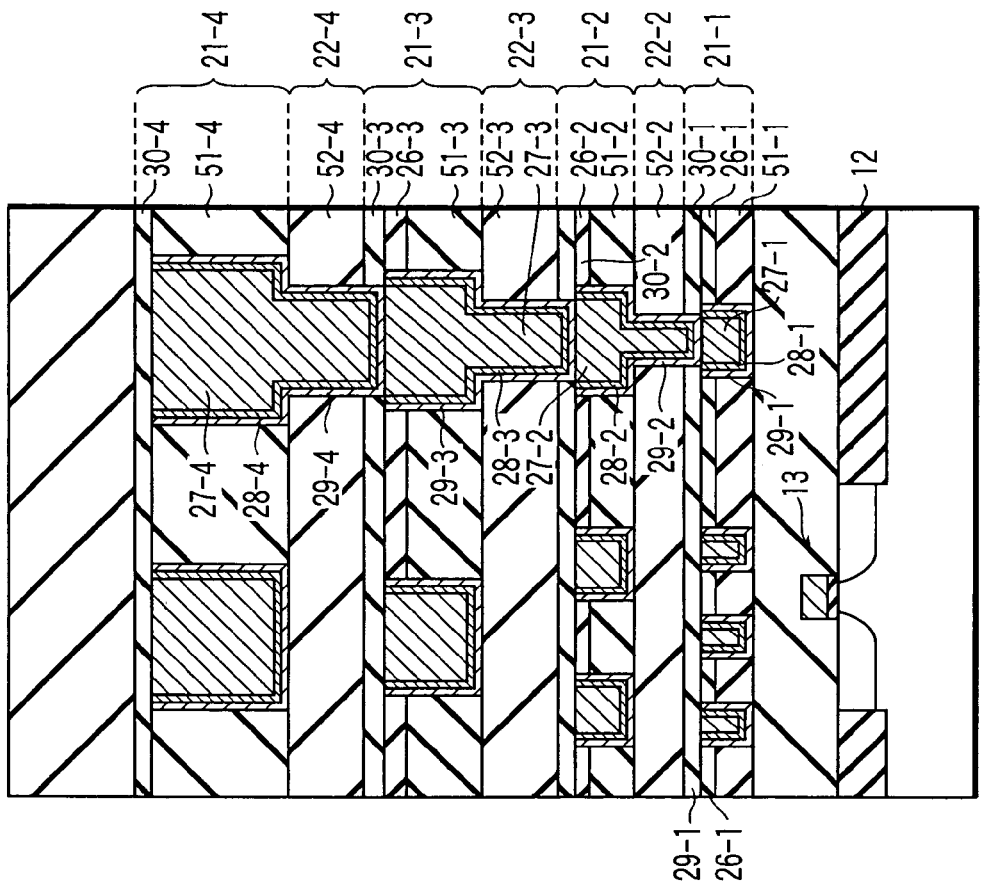
FIG. 11 is a schematic structural diagram showing a cross section of a semiconductor device according to the second embodiment of the present invention.

FIG. 11 is a diagram schematically showing a cross section of the semiconductor device according to the second embodiment. As shown in FIG. 11, this embodiment is an example of a so-called hybrid structure in which the insulating layers formed in the sides of wiring portions (via portions) 21 and connecting sections 22 of the conductive layers are made of different kinds of insulating materials.

As shown in FIG. 11, wiring portion insulating layers 51-1 to 51-4 and connecting portion insulating layers 52-1 to 52-4 are alternately formed one on another. In the wiring portion insulating layers 51-1 to 51-4, wiring layers 21-1 to 21-4 are formed to be embedded therein. In the connecting portion insulating layers 52-1 to 52-4, connecting portions 22-1 to 22-4 are formed to be embedded therein.

On the wiring portion insulating layers 51-1 to 51-4, cap insulating layers 26-1 to 26-4 each made of, for example, $SiO_2$ film, are respectively formed. On the cap insulating layers 26-1 to 26-4, upper diffusion inhibiting layers 30-1 to 30-4 each made of, for example, SiC film, are respectively formed.

As the first wiring portion insulating layer 51-1, for example, an $SiO_2$ film having a specific inductive capacity of about 2.5 is formed.

As the second wiring portion insulating layer 51-2, for example, a polyarylene film having a specific inductive capacity of about 2.7 is formed. As the second connecting portion insulating layer 52-2, for example, an SiOC film having a specific inductive capacity of about 2.5 is formed.

As the third wiring portion insulating layer 51-3, for example, a polyarylene film having a specific inductive capacity of about 2.7 is formed. As the third connecting portion insulating layer 52-3, for example, an SiOC film having a specific inductive capacity of about 2.5 is formed.

As the fourth wiring portion insulating layer 51-4, for example, a silicon oxide film having a specific inductive capacity of about 4.0 is formed. As the fourth connecting portion insulating layer 52-4, for example, a silicon oxide film having a specific inductive capacity of about 4.0 is formed. The rest of the structure is similar to that of the semiconductor device shown in FIG. 1.

With the above-described structure, an advantageous effect similar to that of the first embodiment can be obtained. Further, the wiring portion insulating layers 51 and the connecting portion insulating layers 52 are made of insulating materials having different etching ratios. Thus, the dispersion in depth is narrowed, and therefore the reliability of the device can be improved.

Next, with reference to FIGS. 12 to 15, the method of manufacturing the semiconductor device according to the second embodiment will now be described by taking, as an example, the case of the semiconductor device shown in FIG. 11.

In these diagrams showing the steps of the manufacturing method with the cross sectional views of a semiconductor, the explanations of the steps of forming the element insulating film 12 and the MOSFET 13 are omitted.

First, with a technique similar to that presented in connection with the first embodiment, an inter-layer insulating film 17 is formed on the main surface of a semiconductor substrate 11.

Subsequently, as shown in FIG. 12, for example, an SiOC film having a specific inductive capacity of about 2.5 is deposited by a low pressure plasma CVD method, and thus the first wiring portion insulating layer 51-1. On the first wiring portion insulating layer 51-1, for example, an $SiO_2$ film is deposited by a low pressure plasma CVD method, and thus the cap insulating layer 26-1 is formed. Various methods can be considered as the technique of forming the first wiring portion insulating layer 51-1, as in the case of the first insulating film 25-1.

Next, as shown in FIG. 13, the first wiring layer 21-1 is formed by a step similar to that of the first embodiment. Further, on the entire surface, for example, an SiOC film having a specific inductive capacity of about 2.5 is deposited by a low pressure plasma CVD method, and thus the second connecting portion insulating layer 52-2. Furthermore, on the entire surface, for example, a polyarylene film having a high etching section ratio with respect to the second connecting portion insulating layer 52-2 is deposited by a coating method, and thus the second wiring insulating layer 51-2 is formed.

Then, a hole 55 is made to pierce through the second wiring portion insulating layer 51-2, the second connecting portion insulating layer 52-2 and the first upper diffusion inhibiting layer 30-1 by process of a photolithography or dry etching method such as RIE similar to those shown in FIG. 3. In this process, the second connecting portion insulating layer 52-2 can be etched at a high etching selection ratio with respect to the second wiring portion insulating layer 51-2. In this manner, the dispersion in depth of the holes can be narrowed.

Subsequently, as shown in FIG. 14, the second upper diffusion inhibiting layer 30-2 is formed by deposition, and the second conductive layer 21-2 and the second connecting portion 22-2 are formed by steps similar to those of the first embodiment. Further, on the second upper diffusion inhibiting layer 30-2, for example, a SiOC film having a specific inductive capacity of about 2.5 is deposited by a low pressure plasma CVD method, and thus the third connecting portion insulating layer 52-3 is formed. On the third connecting portion insulating layer 52-3, for example, a polyarylene having a high etching selection ratio with respect to the third connecting portion insulating layer 52-3 is deposited by a coating method, and thus the third wiring portion insulating layer 51-3 is formed.

Figure 15:
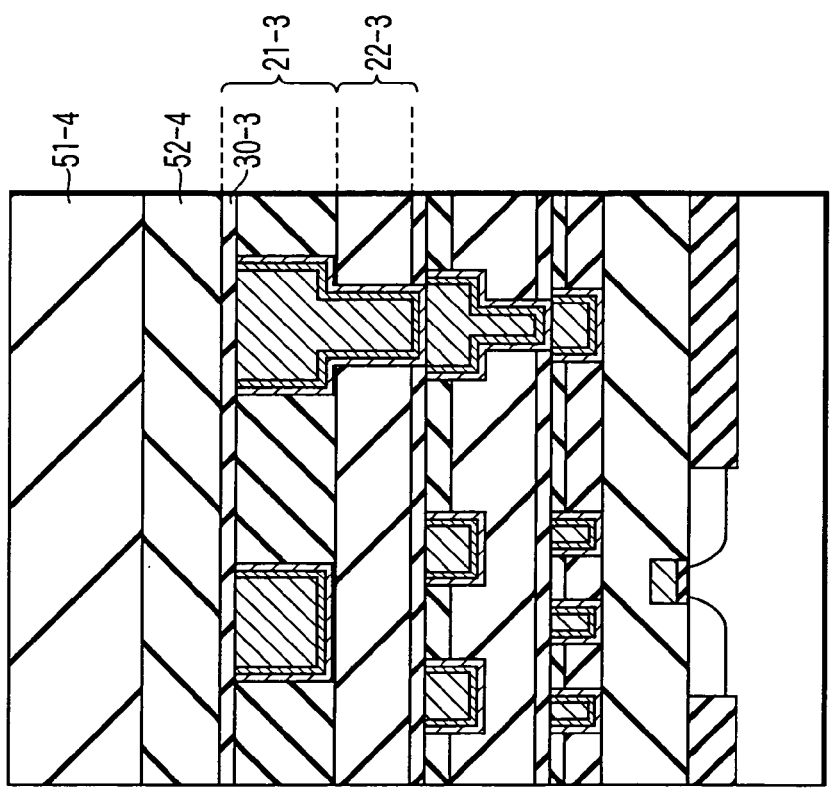
FIG. 15 is a diagram showing still another step in the process of a method of manufacturing the semiconductor device according to the second embodiment.

Next, as shown in FIG. 15, the third conductive layer 21-3 and the third connecting portion 22-3 are formed by steps similar to those described above, and the third upper diffusion inhibiting layer 30-3 is formed. Further, on the third upper diffusion inhibiting layer 30-3, for example, a silicon oxide film having a specific inductive capacity of about 4.0 is deposited by a low pressure plasma CVD method, and thus the fourth connecting portion insulating layer 52-4 is formed. On the fourth connecting portion insulating layer 52-4, for example, a polyarylene having a high etching selection ratio with respect to the fourth wiring portion insulating layer 52-4 is deposited by a coating method, and thus the fourth connecting portion insulating layer 51-4 is formed.

Then, by steps similar to those of the above-described embodiment, the fourth wiring layer 21-4, the fourth connecting portion 22-4 and the fourth diffusion inhibiting layer 30-4 are formed, and thus the semiconductor device shown in FIG. 11 can be manufactured.

As described above, the wiring layers 21 are formed to be embedded in the wiring portion insulating layers 51, respectively, and the connecting portions (Via portions) 22 are formed to be embedded in the wiring portion insulating portions 51, respectively. Further, the wiring portion insulating layers 51 and the connecting portion insulating layers 52 are formed of selected insulating materials having different etching ratios, and therefore the wiring portion insulating layers 51 can be etched at a high selection ration with respect to the connecting portion insulating layers 52. Consequently, while carrying out etching to make holes in which conductive layers are formed, the dispersion in depth can be narrowed.

[Third Embodiment]

Figure 16:
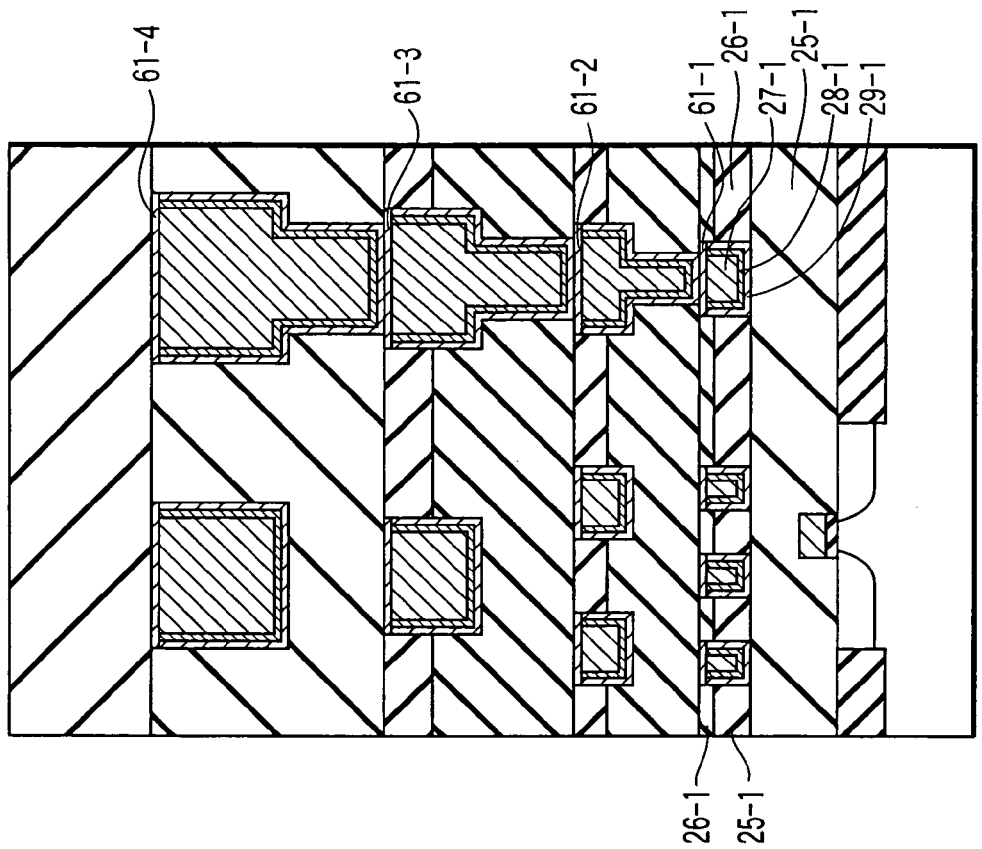
FIG. 16 is a schematic structural diagram showing a cross section of a semiconductor device according to the third embodiment of the present invention.

Next, a semiconductor device and a method of manufacturing the device, according to the third embodiment of the present invention, will now be described with reference to FIGS. 16 to 19. FIG. 16 is a diagram schematically showing a cross section of the semiconductor device according to the third embodiment.

As shown in FIG. 16, this embodiment is described by taking, as an example, a case where upper diffusion inhibiting layers 61-1 to 61-4 are located on only the conductive layers 27, the seed layers 28 and the lower diffusion inhibiting layers 29, respectively. It is preferable that the above-mentioned diffusion inhibiting layers 61-1 to 61-4 should be made of, for example, a metal such as Ta. The rest of the structure is similar to that of the first embodiment.

With the above-described structure, an advantageous effect to that of the first embodiment can be obtained. Further, in this embodiment, conductors are formed only on the conductive layers 27, the seed layers 28 and the lower diffusion inhibiting layers 29 without employing an insulating member having a high specific inductive capacity with respect to the inter-wiring insulating layers (cap insulating layers 26 and insulating layers 25), as the upper diffusion inhibiting layers 61. Consequently, the increase in inter-wiring capacity, which is caused by the upper diffusion inhibiting layers 61, can be suppressed, and thus the signal delay can be further reduced.

Further, in the case where, for example, Cu films are used for the conductive layers 27, diffusion inhibiting layers 61 can be formed on the Cu films respectively by using a metal such as Ta, which has a high adherence with respect to Cu. As a result, the resistance to stress migration or the like, which is caused by boundary diffusion of Cu atom, can be improved, and thus the reliability can be further improved.

Next, with reference to FIGS. 17 to 19, the method of manufacturing the semiconductor device according to the third embodiment will now be described by taking, as an example, the case of the semiconductor device shown in FIG. 16. In the following descriptions, the explanations of the overlapping sections with those of the first and second embodiments will be omitted.

As shown in FIG. 17, first, the first wiring layer 21-1 is formed on the main surface of the semiconductor substrate 11. After that, about 10 nm of the upper portion of each of the first conductive layer 27-1, the first seed layer 28-1, and the first lower diffusion inhibiting layer 29-1 is removed by, for example, a wet etching method.

Subsequently, as shown in FIG. 18, on the entire surface, a Ta film 65 is deposited to have a thickness of 15 nm by, for example, a spattering method.

Then, as shown in FIG. 19, the Ta film 65 that has been deposited is planed by, for example, a CMP method so as to leave the Ta film 65 in the portion removed by the etching, and thus the first upper diffusion inhibiting layer 61-1.

The above-described steps are repeated, and the other upper diffusion inhibiting layers 61-2, 61-3 and 61-4 are formed, and thus the semiconductor device shown in FIG. 16 can be manufactured.

When forming these upper diffusion inhibiting layers 61-2 to 61-4, the upper portion of each of the conductive layers 27-2 to 27-4, the seed layer 28-2 to 28-4, and the lower diffusion inhibiting layers 29-2 to 29-4 is removed by, for example, a wet etching method. The depths of the portions removed by the etching in these layers are about 10 nm, about 15 nm and about 20 nm, respectively. Further, on the entire surface, the Ta films, which give raise to the upper diffusion inhibiting layers 61-2 to 61-4, are deposited by, for example, a spattering method. The thicknesses of these layers are about 15 nm, about 20 nm and about 25 nm, respectively.

Further, in the first to third embodiment, the addition of the element to the basis metal is carried out by use of the spattering target of the alloy. Here, it is alternatively possible that the element is added in the following manner. That is, the layer is deposited by using a copper target that does not contain any additive element, and then the additive element is deposited, followed by a heat treatment. It is further alternatively possible that the element is added by means of a technique such as ion implantation.

It should be noted here that, naturally, the number of wiring layers is not limited to four as long as it is two or more.

Further, the above-described embodiments were described in connection with only the case where the copper (cu) film is used as an example of the basis metal; however it is alternatively possible that the conductive layers are formed by using some other basis metal than copper, that is, for example, using silver or the like as the basis metal.

Further, the above-described embodiments were described in connection with the case where there is only one component in the additive element; however it is alternatively possible that there are two or more components. Also, not only the element used to improve the reliability of the wiring layers, is contained, but also an additive element that can secure a adhesion, for example, can be contained. Apart from these, the present invention can be remodeled into various versions as long as the essence of the invention does not fall out of the scope of the invention.

As described in detail, according to the embodiments of the present invention, the additive element is supplied to at least one layer of a basis metal, of the conductive layers that constitute the multi-layer wiring portion. With this structure, the additive element can be supplied to the basis metal of the thin film layer located at the lowermost section, that has the minimum processible measurements. Thus, the current density of the wiring layers can be lowered, and the diffusion at the boundaries between the wiring layers can be suppressed. In this manner, the reliability of the wiring can be improved. Consequently, it is possible to achieve multi-layer wiring that can improve the wiring reliability even with a thin film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate; and
   a multi-layer wiring portion including insulating layers and wiring layers alternately stacked one on another on a main surface of the semiconductor substrate, a resistance value of a wiring layer located on an upper side of an adjacent pair of wiring layers included in the multi-layer wiring portion is lower than or equal to that of a wiring layer located on a lower side of the adjacent pair, and the resistance value of the lowermost layer is higher than that of the uppermost layer, and a specific inductive capacity of an insulating layer located on an upper side of an adjacent pair of insulating layers included in the multi-layer wiring portion is higher than or equal to that of an insulating layer located on a lower side of the adjacent pair, and the specific inductive capacity of the lowermost layer is lower than that of the uppermost layer.

2. The semiconductor device according to claim 1, wherein all of the wiring layers are made of a same basis metal, and at least one of the wiring layers contains an additive element that serves to raise a resistance value of the basis metal, and a concentration of the additive element is lower in an upper layer side than that of a lower layer side.

3. The semiconductor device according to claim 1, wherein all of the wiring layers are made of a same basis metal, and at least one of the wiring layers contains an additive element that serves to raise a resistance value of the basis metal, and a concentration of the additive element is higher as a length of a boundary per cross sectional area is larger in the wiring layer.

4. The semiconductor device according to claim 1, wherein each of the wiring layers is embedded in a wiring groove of a respective one of the insulating layer.

5. The semiconductor device according to claim 2, wherein the basis metal contains at least one of copper, aluminum and silver.

6. The semiconductor device according to claim 3, wherein the basis metal contains at least one of copper, aluminum and silver.

7. The semiconductor device according to claim 2, wherein the additive element contains at least one of Mg, Ti, Al, Sn, Pb, Ru, Rh, Cr, Ag, Co, In and Cu.

8. The semiconductor device according to claim 3, wherein the additive element contains at least one of Mg, Ti, Al, Sn, Pb, Ru, Rh, Cr, Ag, Co, In and Cu.

9. The semiconductor device according to claim 1, wherein at least one of the wiring layers has a connecting portion that connects an adjacent pair of wiring layers located in a vertical direction, a width of the connection portion is narrower than the wiring layers, and the connecting portion is integrated with the respective wiring layer with a same material as that of the wiring layer, and at least one of the insulating layers including a wiring portion insulating layer and a connecting portion insulating layer formed alternately, the wiring layer being formed within the wiring portion insulating layer and the connecting portion being formed within the connecting portion insulating layer.

10. The semiconductor device according to claim 2, wherein at least one of the wiring layers has a connecting portion that connects an adjacent pair of wiring layers located in a vertical direction, a width of the connection portion is narrower than the wiring layers, and the connecting portion is integrated with the respective wiring layer with a same material as that of the wiring layer, and at least one of the insulating layers including a wiring portion insulating layer and a connecting portion insulating layer formed alternately, the wiring layer being formed within the wiring portion insulating layer and the connecting portion being formed within the connecting portion insulating layer.

11. The semiconductor device according to claim 3, wherein at least one of the wiring layer has a connecting portion that connects an adjacent pair of wiring layers located in a vertical direction, a width of the connection portion is narrower than the wiring layers, and the connecting portion is integrated with the respective wiring layer with a same material as that of the wiring layer, and at least one of the insulating layers including a wiring portion insulating layer and a connecting portion insulating layer formed alternately, the wiring layer being formed within the wiring portion insulating layer and the connecting portion being formed within the connecting portion insulating layer.

12. The semiconductor device according to claim 1, wherein the resistance value of an inner section of each of the wiring layers is lower than or equal to that of a section close to a surface thereof.

13. The semiconductor device according to claim 2, wherein the concentration of the additive element of an inner section of each of the wiring layers is lower than or equal to that of a section close to a surface thereof.

14. The semiconductor device according to claim 3, wherein the concentration of the additive element of an inner section of each of the wiring layers is lower than or equal to that of a section close to a surface thereof.

15. The semiconductor device according to claim 1, further comprising: an insulating gate-type electric field effect transistor provided in the semiconductor substrate and connected selectively to the wiring layers within the multi-layer wiring portion.

16. The semiconductor device according to claim 1, further comprising:
a seed layer formed between one of the insulating layer and a respective one of the wiring layers; and
an additive element configured to inhibit boundary diffusion of the seed layer, a concentration of the additive element being lower in the uppermost layer than in the lowermost layer.

* * * * *